US012564035B2

(12) United States Patent
Reshotko et al.

(10) Patent No.: US 12,564,035 B2
(45) Date of Patent: Feb. 24, 2026

(54) AIRGAPS USED IN BACKEND MEMORY STRUCTURES

(71) Applicant: Intel Corporation, Santa Clara, CA (US)

(72) Inventors: Miriam R. Reshotko, Portland, OR (US); Van H. Le, Beaverton, OR (US); Travis W. Lajoie, Forest Grove, OR (US); Abhishek Anil Sharma, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 825 days.

(21) Appl. No.: 17/704,410

(22) Filed: Mar. 25, 2022

(65) Prior Publication Data

US 2023/0307352 A1    Sep. 28, 2023

(51) Int. Cl.
| | |
|---|---|
| *H01L 23/522* | (2006.01) |
| *H01L 23/532* | (2006.01) |
| *H10B 12/00* | (2023.01) |

(52) U.S. Cl.
CPC ...... *H01L 23/5226* (2013.01); *H01L 23/5329* (2013.01); *H10B 12/09* (2023.02); *H10B 12/315* (2023.02)

(58) Field of Classification Search
CPC ............. H01L 23/5226; H01L 23/5329; H01L 23/5222; H01L 23/53295; H01L 21/7682; H10B 12/09; H10B 12/315
See application file for complete search history.

(56) References Cited

U.S. PATENT DOCUMENTS

| | | | | |
|---|---|---|---|---|
| 9,349,687 B1 * | 5/2016 | Gates | ................ | H01L 21/76834 |
| 2020/0194434 A1 * | 6/2020 | Alzate Vinasco | ... | H10D 30/031 |
| 2021/0408049 A1 * | 12/2021 | Young | .................... | H10B 53/40 |

* cited by examiner

*Primary Examiner* — Jonathan Han
(74) *Attorney, Agent, or Firm* — Arcane Law PLLC

(57) ABSTRACT

Techniques are provided herein for forming backend memory structures with airgaps in an interconnect region above semiconductor devices. The airgaps may be provided between conductive features, such as wordlines, to reduce parasitic capacitance. An interconnect region above a plurality of semiconductor devices includes any number of interconnect layers. A first interconnect layer includes first conductive layers (e.g., wordlines) extending in a first direction with airgaps between adjacent first conductive layers. A second interconnect layer over the first interconnect layer includes at least portions of memory cells over corresponding first conductive layers. A third interconnect layer over the second interconnect layer includes a second conductive layer (e.g., bitline) extending in a second direction over one or more of the at least portions of memory cells. The presence of airgaps between the first conductive layers allows for a tighter pitch between memory cells and reduced total energy consumption among the memory cells.

20 Claims, 10 Drawing Sheets

LOGIC

MEMORY

206

208

204

202

210

208

210

204

202

228
406
404
402
208

226

500

600

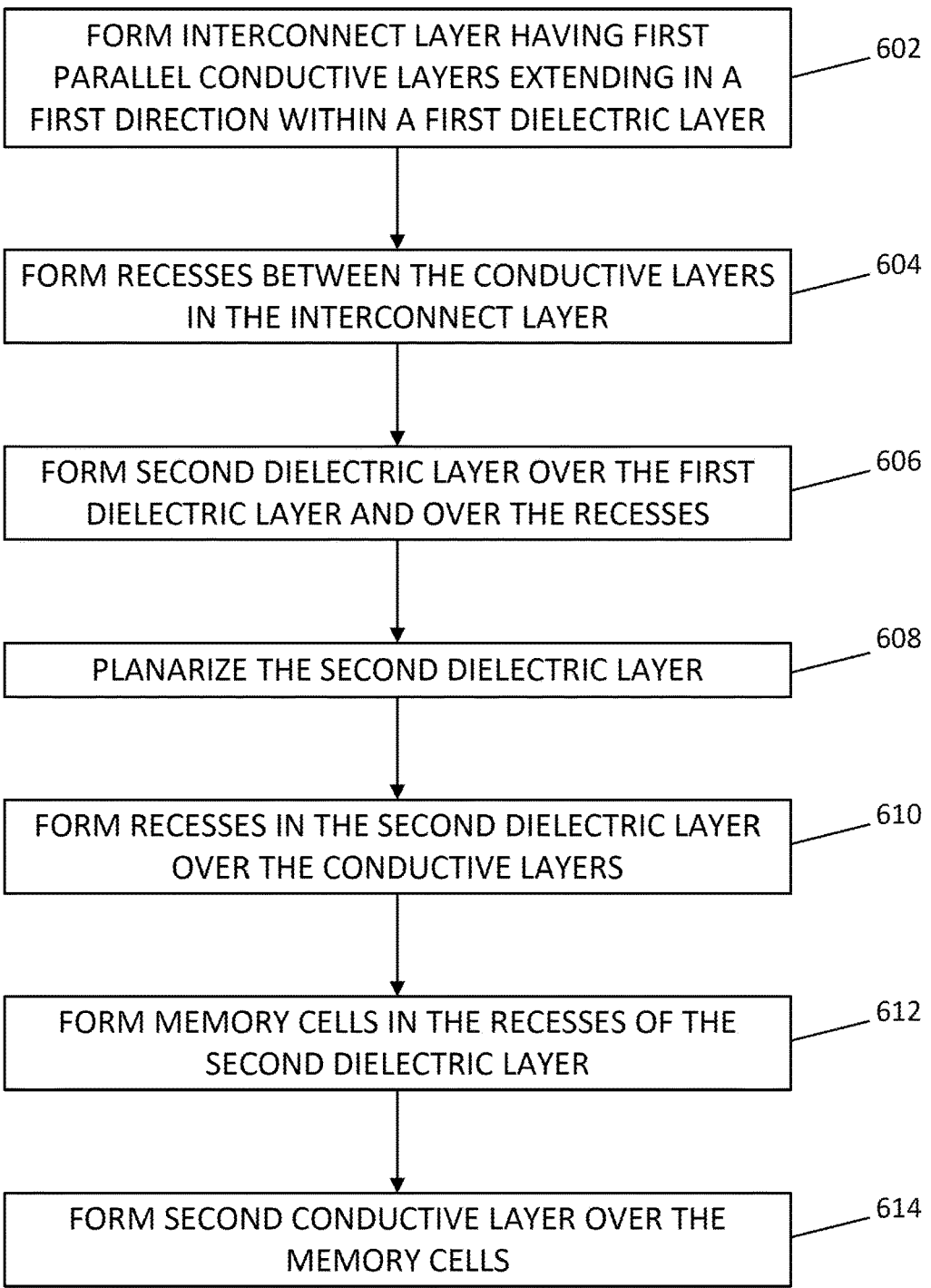

FORM INTERCONNECT LAYER HAVING FIRST PARALLEL CONDUCTIVE LAYERS EXTENDING IN A FIRST DIRECTION WITHIN A FIRST DIELECTRIC LAYER — 602

FORM RECESSES BETWEEN THE CONDUCTIVE LAYERS IN THE INTERCONNECT LAYER — 604

FORM SECOND DIELECTRIC LAYER OVER THE FIRST DIELECTRIC LAYER AND OVER THE RECESSES — 606

PLANARIZE THE SECOND DIELECTRIC LAYER — 608

FORM RECESSES IN THE SECOND DIELECTRIC LAYER OVER THE CONDUCTIVE LAYERS — 610

FORM MEMORY CELLS IN THE RECESSES OF THE SECOND DIELECTRIC LAYER — 612

FORM SECOND CONDUCTIVE LAYER OVER THE MEMORY CELLS — 614

FIG. 6

AIRGAPS USED IN BACKEND MEMORY STRUCTURES

FIELD OF THE DISCLOSURE

The present disclosure relates to integrated circuits, and more particularly, to backend memory structures in interconnect layers.

BACKGROUND

As integrated circuits continue to scale downward in size, a number of challenges arise. For instance, as transistor area decreases, so too do the dimensions for interconnects made to the various transistor structures, such as gate structures, drain regions, and source regions. Structures formed in such interconnect layers may suffer from parasitic effects as they become more densely packed. Accordingly, there remain a number of non-trivial challenges with respect to the formation of densely packed backend structures.

BRIEF DESCRIPTION OF THE DRAWINGS

FIG. 6 is a flowchart of a fabrication process for an integrated circuit including an interconnect region having memory structures with airgaps between certain conductive structures, in accordance with an embodiment of the present disclosure.

Figure 1:
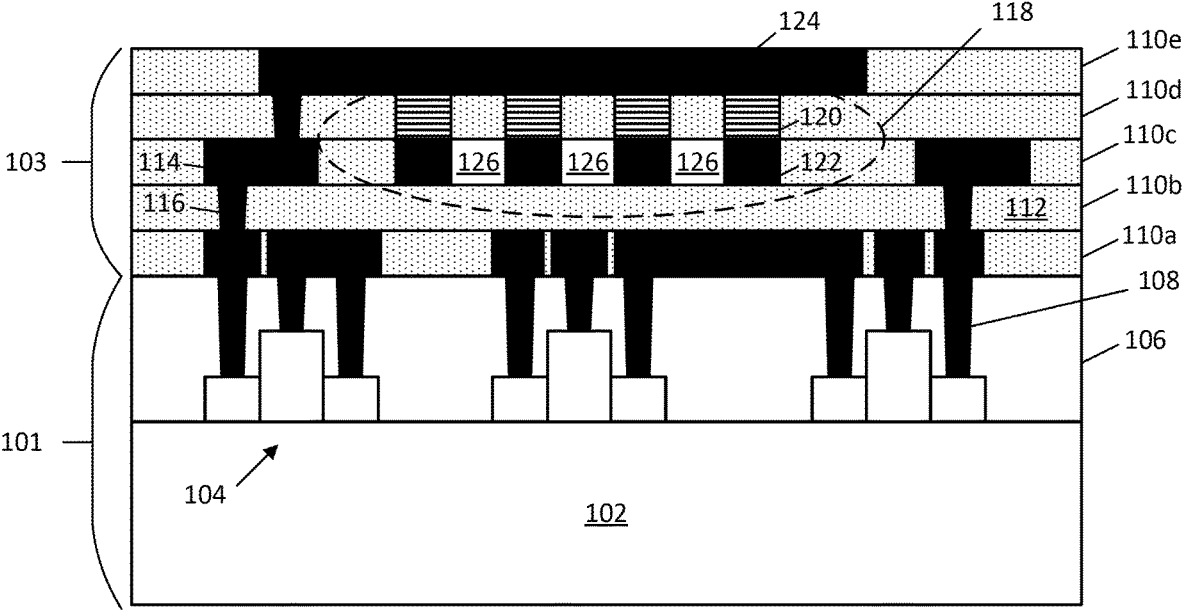
FIG. 1 is a cross-sectional view that illustrates an example portion of an integrated circuit configured with an interconnect region having backend memory structures over a plurality of semiconductor devices, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

Techniques are provided herein for forming backend memory structures with airgaps in an interconnect region above semiconductor devices. The airgaps may be provided between certain conductive features, such as wordlines, to reduce parasitic capacitance. Although the techniques can be used in any number of integrated circuit applications, they are particularly useful with respect to interconnect regions over size-constrained transistors, such as those cells that use finFETs, gate-all-around transistors, or other transistor technologies. An interconnect region above a plurality of semiconductor devices may include any number of interconnect layers. Some such interconnect layers may just contain interconnect features, while other such layers may just contain memory cells (e.g., an access transistor and/or a storage capacitor). Note that memory cell capacitors may be in the same layer as the access transistor or in a different layer. In still other cases, some interconnect layers may include both interconnect features and memory cells. According to some embodiments, a first interconnect layer includes first conductive layers (e.g., wordlines) extending in a first direction with airgaps between adjacent first conductive layers. According to some embodiments, one or more second interconnect layers over the first interconnect layer includes memory cells over corresponding first conductive layers. According to some embodiments, a third interconnect layer over the second interconnect layer(s) includes a second conductive layer (e.g., bitline) extending in a second direction over one or more of the memory cells. The presence of the airgaps between the first conductive layers allows for a tighter pitch between memory cells and reduced total energy consumption among the memory cells. Numerous variations and embodiments will be apparent in light of this disclosure.

General Overview

As previously noted above, there are a number of non-trivial challenges with respect to forming densely packed backend memory structures while also maintaining acceptable memory performance. In more detail, closely packed memory cells increase parasitic capacitance between the conductive structures (such as the wordlines and/or bitlines), which in turn leads to a degradation in the performance of the memory cells. Various low-k dielectric (where k is the dielectric constant of the material) materials may be used within the interconnect layers to decrease the capacitance, but even when using such materials, the average k value between memory cells may only be reduced to around 2.5. As such, parasitic capacitance may still be a problem.

Thus, and in accordance with some embodiments of the present disclosure, techniques are provided herein to form backend memory cells with airgaps between them to reduce parasitic capacitance. Airgaps themselves have an average k value of around 1, and their use within an interconnect layer between bitlines or wordlines of the memory cells can provide a total k value below 2.0. In some embodiments, the airgaps are filled with an inert gas and may be at vacuum pressure. As will be appreciated, the term airgap as used herein does not mean that the region must necessarily be filled with air (e.g., oxygen and nitrogen), as it can be filled with any type of gas (e.g., one or more process gases), or devoid of any gas. The backend memory cells may be formed within various levels of interconnect layers over semiconductor devices (e.g., transistors) of a previously formed device layer. Any kind of memory structure can be used, such as thin film transistor (TFT) memory cells or phase change memory cells. In some embodiments, the TFT memory cells may further utilize capacitor structures formed in the interconnect layers to complete a dynamic random-access memory (DRAM). In an embodiment, first conductive layers (e.g., wordlines) are formed in a first interconnect layer having airgaps between the first conductive layers in the first interconnect layer. Memory cells may be formed in one or more second interconnect layers over the first interconnect layer. A given memory cell may be formed over a corresponding first conductive layer. Second conductive layers (e.g., bitlines) may be formed in a third interconnect layer over the second interconnect layer(s) to effectively sandwich each memory cell between a corresponding first conductive layer and a corresponding second conductive layer.

According to an embodiment, an integrated circuit includes a plurality of semiconductor devices and an interconnect region above the plurality of semiconductor devices and having a plurality of stacked interconnect layers. A first interconnect layer of the plurality of stacked interconnect layers includes a plurality of first conductive layers extending lengthwise along a first direction and airgaps between adjacent ones of the plurality of first conductive layers. A set of one or more second interconnect layers of the plurality of stacked interconnect layers is over the first interconnect layer and has a plurality of memory cells with each memory cell being over a corresponding first conductive layer. Note that the memory cell may be contained in one or more interconnect layers (e.g., a TFT or other access device of a given memory cell design may be in a one interconnect layer and a MIM capacitor or other storage device of that memory cell design may be in one or more other interconnect layers). A third interconnect layer of the plurality of stacked interconnect layers is over the second interconnect layer(s) and has a second conductive layer extending lengthwise along a second direction different from the first direction.

According to another embodiment, an integrated circuit includes an interconnect region above a plurality of semiconductor devices and having a plurality of stacked interconnect layers. A first interconnect layer of the plurality of stacked interconnect layers includes a plurality of parallel first conductive layers extending lengthwise along a first direction and airgaps between adjacent ones of the plurality of parallel first conductive layers. A set of one or more second interconnect layers of the plurality of stacked interconnect layers is over the first interconnect layer and has a plurality of memory cells with each memory cell being over a corresponding first conductive layer. A third interconnect layer of the plurality of stacked interconnect layers is over the second interconnect layer(s) and has a plurality of parallel second conductive layers extending lengthwise along a second direction different from the first direction. At least one of the second conductive layers extends over the plurality of memory cells.

According to another embodiment, a method of forming an integrated circuit includes forming a first interconnect layer above a plurality of semiconductor devices and forming a set of one or more second interconnect layers over the first interconnect layer. Forming the first interconnect layer includes forming a first dielectric layer, forming first recesses in the first dielectric layer, forming conductive layers in the first recesses, and forming second recesses in the first dielectric layer between adjacent ones of the conductive layers. Forming the second interconnect layer(s) includes forming a second dielectric layer over the first dielectric layer and over the second recesses, such that airgaps are formed within the second recesses. The method may further include, for instance, forming third recesses in the second dielectric layer over the conductive layers, and forming at least partial memory cells in the third recesses. Alternatively, various material layers may be blanket deposited over the first interconnect layer and etched back to form islands of memory cells over the conductive layers. Additional interconnect layers may be provisioned to complete the memory cells, according to some embodiments, such as those having a relatively tall capacitor structure (e.g., U-shaped or pillar-shaped MIM capacitors). In a more general sense, while a memory cell may be contained within a single interconnect layer, it need not be.

The techniques can be used with any type of planar and non-planar transistors, including finFETs (sometimes called double-gate transistors, or tri-gate transistors), nanowire and nanoribbon transistors (sometimes called gate-all-around transistors), and thin film transistors, to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a remove metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide). The memory cells may include TFTs having metal oxide semiconductor materials, such as indium gallium zinc oxide (InGaZnO), indium zinc oxide (InZnO), indium oxide (InO), or gallium zinc oxide (GaZnO) to name a few examples.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of backend memory structures with one or more airgaps in the interconnect layer between the conductive wordlines and/or conductive bitlines. A dielectric liner (such as silicon nitride) may also be observable around the outer surfaces of the recesses that include the airgaps.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," "bottom," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The integrated circuit or structure may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer. Example layers include, for instance, a liner or barrier layer (e.g., a relatively thin layer of tantalum nitride), an etch stop layer (e.g., a relatively thin layer of silicon nitride), an interconnect layer (e.g., a relatively thick layer that includes dielectric material and one or more conductive interconnect features and/or active devices and/or passive devices), and a device layer (e.g., a relatively thick layer that includes metal oxide semiconductor field effect transistors or MOSFETs along with dielectric materials and conductive materials)

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Architecture

FIG. 1 is a cross-sectional view that illustrates an example portion of an integrated circuit having an interconnect region above a plurality of semiconductor devices, in accordance with an embodiment of the present disclosure. The semiconductor devices in this example are non-planar metal oxide semiconductor (MOS) transistors, such as tri-gate or gate-all-around (GAA) transistors, although other transistor topologies and types can also benefit from the techniques provided herein, as will be appreciated (e.g., planar transistors, thin film transistors, or any other transistors to which contact can be made).

According to some embodiments, the integrated circuit includes a device region 101, and an interconnect region 103 over the device region 101. Device region 101 may include, for example, a plurality of semiconductor devices 104 along with one or more other layers or structures associated with the semiconductor devices 104. For example, device region 101 can also include a substrate 102 and one or more dielectric layers 106 that surround active portions of the semiconductor devices 104 (e.g., logic or compute transistors, input/output transistors, and/or radio frequency transistors). Device region 101 may also include one or more conductive contacts 108 that provide electrical contact to transistor elements such as gate structures, drain regions, or source regions. Conductive contacts 108 may include, for example, tungsten, ruthenium, or copper, although other metal or metal alloy materials are possible.

Substrate 102 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, the substrate can be a semiconductor-on-insulator substrate having a desired semiconductor layer over a buried insulator layer (e.g., silicon over silicon dioxide). Alternatively, the substrate can be a multilayer substrate or superlattice suitable for forming nanowires or nanoribbons (e.g., alternating layers of silicon and SiGe, or alternating layers indium gallium arsenide and indium phosphide). Any number of substrates can be used. In some embodiments, backside processing is used to remove substrate 102 and form additional backside interconnect layers.

Interconnect region 103 includes a plurality of interconnect layers 110a-110e stacked over one another. Each interconnect layer can include a dielectric material 112 along with one or more different conductive features, active devices, and/or passive devices. Dielectric material 112 can be any dielectric, such as silicon oxide, silicon oxycarbide, silicon nitride, or silicon oxynitride. Dielectric material 112 may be formed using any known dielectric deposition technique such as chemical vapor deposition (CVD), plasma-enhanced chemical vapor deposition (PECVD), flowable CVD, spin-on dielectric, or atomic layer deposition (ALD). The one or more conductive features can include any number of conductive traces 114 and conductive vias 116 arranged in any pattern across the interconnect layers 110a-110e to carry signal and/or power voltages to/from the various semiconductor devices 104. As used herein, conducive vias, such as conductive via 116, extend at least partially through an interconnect layer to connect between conductive traces on an upper interconnect layer and/or a lower interconnect layer, while conductive contacts, such as conductive contact 108, extend at least partially through a portion of dielectric layer 106 to contact one or more transistor elements. Although interconnect region 103 is illustrated with only five interconnect layers, any number of interconnect layers can be used within interconnect region 103. Interconnect layers are sometimes called metallization layers (e.g., such as M0 through M15).

Any of conductive traces 114 and conductive vias 116 can include any number of conductive materials, with some examples including copper, ruthenium, tungsten, cobalt, molybdenum, titanium, tantalum, and alloys thereof. In some cases, any of conductive traces 114 and conductive vias 116 include a relatively thin liner or barrier, such as manganese, ruthenium, titanium nitride, titanium silicide, tungsten carbo-nitride (WCN), physical vapor deposited (PVD) or ALD tungsten, tantalum, or tantalum nitride, to name a few examples.

Note that each of the various conductive vias 116 and conductive contacts 108 are shown with tapered profiles to indicate a more natural appearance due to the etching process used to form the openings, although such tapering may not always be present. Any degree of tapering may be observed depending on the etch parameters used and the thickness of the dielectric layer being etched through. Furthermore, conductive vias may be stacked one over the other through different dielectric layers of interconnect region

103. However, in some examples, a single via recess may be formed through more than one dielectric layer yielding a taller, more tapered conductive via that extends through two or more dielectric layers (e.g., a deep via or supervia).

As can be further seen in this example embodiment, interconnect region 103 also includes a memory array 118 having any number of backend memory structures. Memory array 118 may extend vertically across any number of interconnect layers (e.g., one, two or many). In some embodiments, memory array 118 includes a plurality of memory cells 120 sandwiched between first conductive layers 122 extending in a first direction and a second conductive layer 124 extending in a second direction. First conductive layers 122 may be parallel wordlines extending into and out of the page as part of interconnect layer 110c. Second conductive layer 124 may be one layer of several parallel bitlines as part of interconnect layer 110e that extend orthogonally to first conductive layers 122. As noted above, memory cells 120 can include any number of layers to form a given memory structure, such as a TFT memory cell or a phase change memory cell. This example shows memory cells 120 contained within interconnect layer 110d (such as further shown in FIG. 4), but other embodiments may have a memory cell that extends vertically through two or more such interconnect layers.

According to some embodiments, airgaps 126 are present between adjacent first conductive layers 122 in interconnect layer 110c. Airgaps 126 provide a low dielectric constant between laterally adjacent first conductive layers 122, thus allowing for tighter pitches between first conductive layers 122, according to some embodiments. Airgaps 126 may include, for example, an inert gas and/or be at vacuum pressure. In some embodiments, one or more dielectric liners may be present along at least the sidewalls of first conductive layers 122 within airgaps 126. The one or more dielectric liners may be included to protect the exposed metal of first conductive layers 122 and to prevent electromigration.

Fabrication Methodology

FIGS. 2A-2H are cross-sectional views that collectively illustrate an example process for forming a portion of an interconnect region of an integrated circuit, in accordance with an embodiment of the present disclosure. Each figure shows an example structure that results from the process flow up to that point in time, so the depicted structure evolves as the process flow continues, culminating in the structure shown in FIG. 2H, which provides backend memory structures using airgaps to reduce parasitic capacitance. Such a structure may be part of an overall integrated circuit (e.g., such as a processor or memory chip, or a system-on-chip) that includes, for example, digital logic cells and/or memory cells and analog mixed signal circuitry. Thus, the illustrated integrated circuit structure may be part of a larger integrated circuit that includes other integrated circuitry not depicted. Example materials and process parameters are given, but other materials or parameters will be appreciated in light of this disclosure.

Figure 2A:
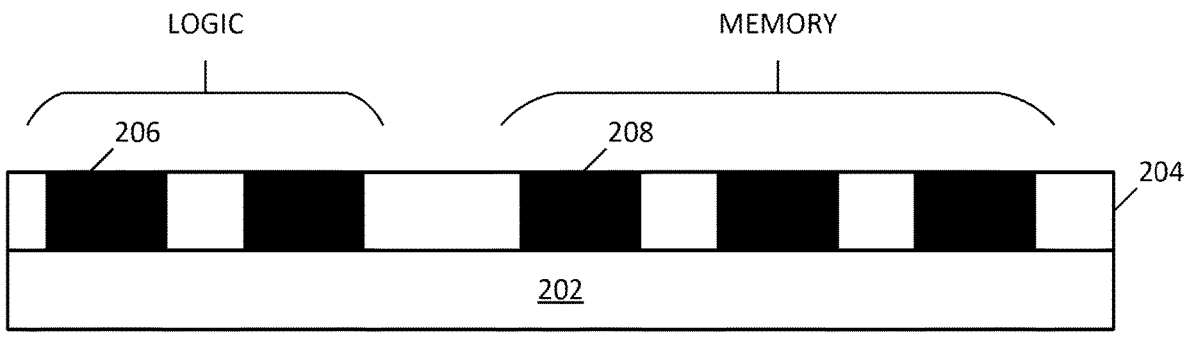
FIGS. 2A-2H are cross-sectional views that collectively illustrate an example process for forming an interconnect region having memory structures with airgaps between certain conductive structures, in accordance with an embodiment of the present disclosure.

FIG. 2A is a cross-sectional view taken through some interconnect layers of a plurality of stacked interconnect layers. Accordingly, any number of lower interconnect layers 202 may be at any position within interconnect region 103. Interconnect layers 202 may include any conductive traces and/or vias within any number of dielectric layers. According to some embodiments, a first interconnect layer includes a dielectric layer 204 that may be any dielectric material, such as silicon oxide, silicon oxynitride, silicon nitride, or silicon oxycarbide. Dielectric layer 204 may be deposited using any known dielectric deposition technique, such as CVD, PECVD, flowable CVD, spin-on dielectric, or ALD. Dielectric layer 204 may have a height between about 15 nm and about 50 nm. According to some embodiments, the first interconnect layer can include any number of conductive traces 206 associated with logic functions and any number of first conductive traces 208 associated with memory functions. For example, first conductive traces 208 may be wordlines that run parallel to one another into and out of the page.

First conductive traces 208 may be formed by first forming recesses within dielectric layer 204 followed by filling the recesses with a conductive material, such as copper, that is deposited using any one of electroplating, electroless plating, CVD, or PECVD, to name a few examples. After deposition of the conductive material within the recesses, a polishing process may be performed using, for example, chemical mechanical polishing (CMP) to planarize a top surface of both first conductive traces 208 and dielectric layer 204. In some embodiments, a thin barrier layer is conformally deposited (e.g., via ALD or CVD) first along the inner surfaces of the recesses prior to the deposition of the remaining conductive material. The thin barrier layer may include, for example, tantalum or titanium, or a nitride of these.

According to some embodiments, first conductive traces 208 have a pitch between about 30 nm and about 300 nm. In one example, first conductive traces 208 have a pitch between about 100 nm and about 150 nm. Only three conductive traces 208 are illustrated here for clarity, but any number of conductive traces 208 may be formed within the memory array region.

Figure 2B:
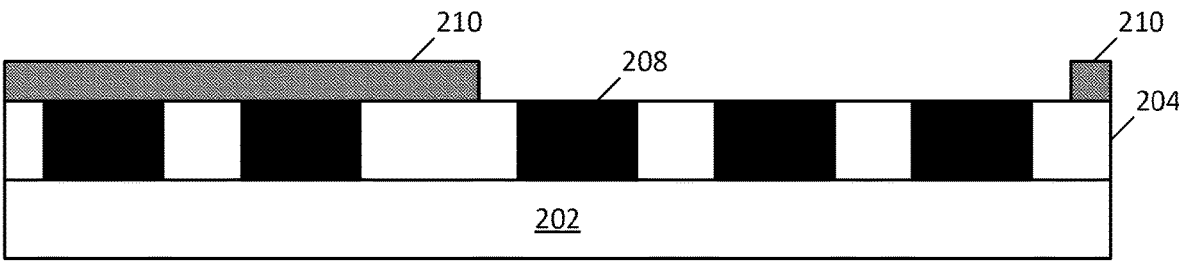

FIG. 2B is a cross-sectional view of the structure depicted in FIG. 2A after formation of a masking layer 210 that protects any logic conductive traces 206 while exposing first conductive traces 208 associated with the memory array. Masking layer 210 may be, for example, a carbon hard mask (CHM), any type of photoresist, or other type of hard mask (e.g., dielectric or metal) material.

Figure 2C:
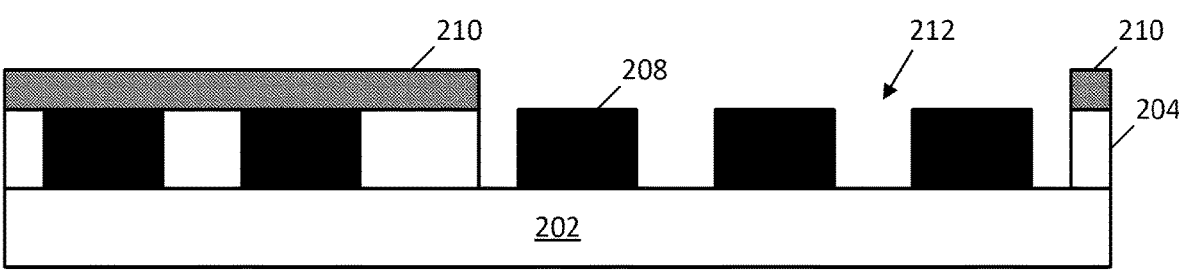

FIG. 2C is a cross-sectional view of the structure depicted in FIG. 2B after etching through dielectric layer 204 around first conductive traces 208, according to some embodiments. The removal of dielectric layer 204 from between adjacent conductive traces 208 creates recesses 212. Masking layer 210 protects dielectric layer 204 from between other conductive traces in the first interconnect layer not associated with the memory array. In some examples, an isotropic etching process is performed to selectively remove the dielectric material from around conductive traces 208. Accordingly, undercutting beneath first conductive traces 208 may occur to some degree. Note that the etch is selective to the first conductive traces 208 and masking layer 210.

Figure 2D:
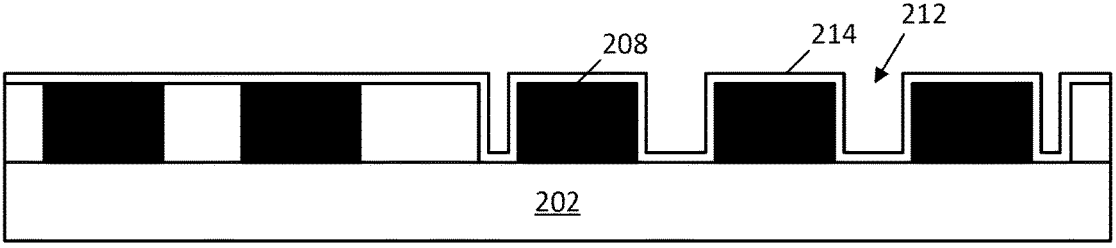

FIG. 2D is a cross-sectional view of the structure depicted in FIG. 2C after formation of a dielectric liner 214. According to some embodiments, dielectric liner 214 acts as an etch stop layer to protect first conductive traces 208 and also to protect the bottom surface of recesses 212 from any further etching. Dielectric liner 214 may be any suitable dielectric material depositing conformally using, for example, ALD. In some examples, dielectric liner 214 includes silicon nitride, silicon oxynitride, or aluminum oxide. Dielectric liner 214 may be deposited to a final thickness between about 2 nm and about 6 nm, or around 4 nm. Depending on the pitch between conductive traces 208, dielectric liner 214 may be thicker (e.g., between 10 nm and 20 nm).

Figure 2E:
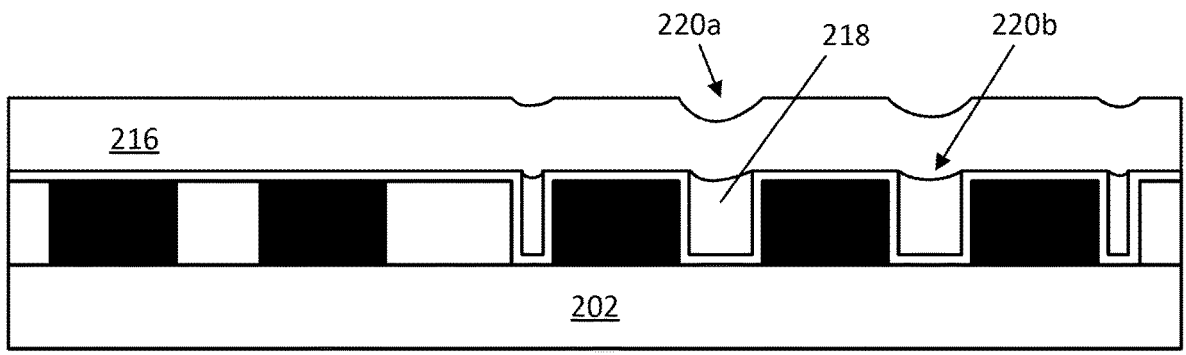

FIG. 2E is a cross-sectional view of the structure depicted in FIG. 2D after the formation of a second interconnect layer over the first interconnect layer. The second interconnect layer includes another dielectric layer 216 that is deposited such that it does not fill in recesses 212. In some embodiments, dielectric layer 216 includes a low-K dielectric material, such as porous silicon oxide or porous silicon oxycarbide, and is deposited using PECVD or PVD. The deposition process parameters may be tuned to deposit dielectric layer 216 such that it does not conformally coat the inner surfaces of recesses 212. To this end, the formation of dielectric layer 216 causes the formation of trapped airgaps 218 between conductive traces 208. Airgaps 218 may include an inert gas and/or any gas or plasma used during the deposition of dielectric layer 216. According to some embodiments, a top surface of dielectric layer 216 may include any number of divots 220a aligned over corresponding airgaps 218. In addition, or alternatively, a divot 220b may extend into an upper portion of the corresponding airgap 218, from a bottom surface of dielectric layer 216, according to some embodiments.

Figure 2F:
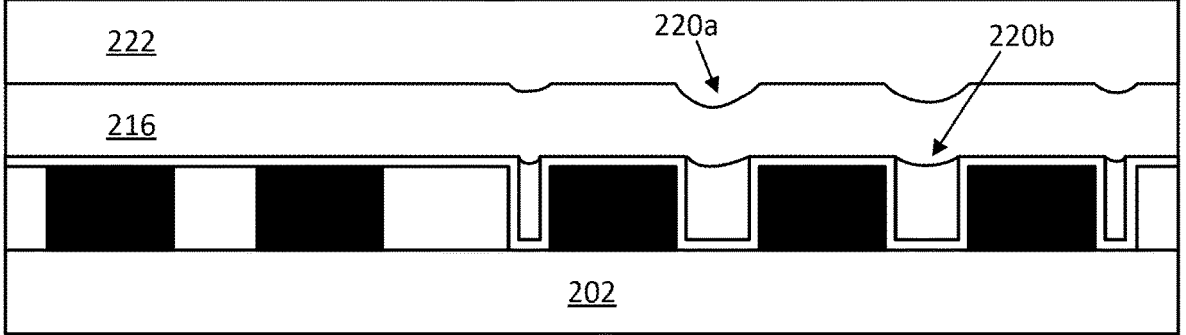

FIG. 2F is a cross-sectional view of the structure depicted in FIG. 2E following the formation of a sacrificial material 222 over dielectric layer 216. Sacrificial material 222 may be any dielectric material and is provided to effectively fill in divots 220a and provide a planar top surface for further processing. Sacrificial material 222 may deposited using any known deposition technique, such as CVD, PECVD, flowable CVD, spin-on dielectric, or ALD, and then planarized (e.g., using chemical mechanical polishing, or CMP). In some embodiments, sacrificial material 222 is the same dielectric as dielectric layer 216 (e.g., porous silicon oxide or porous silicon oxycarbide), but it need not be the same. In some embodiments, sacrificial material 222 is any dielectric material having a similar etch rate to dielectric layer 216.

Figure 2G:
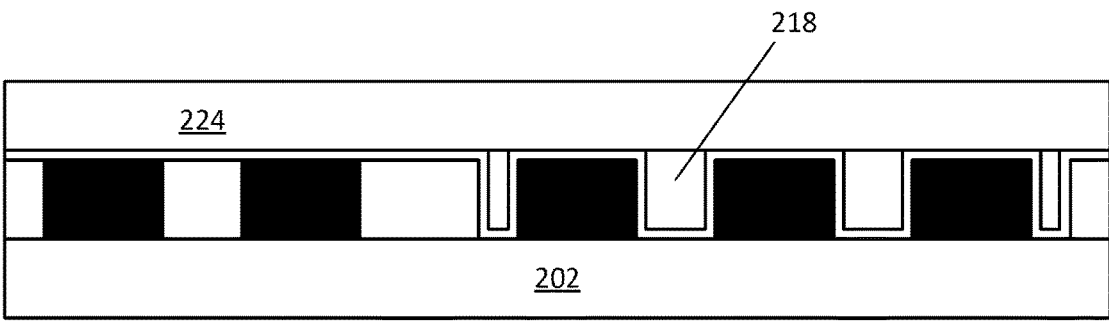

FIG. 2G is a cross-sectional view of the structure depicted in FIG. 2F following polishing or etching of the structure to form dielectric layer 224. According to some embodiments, dielectric layer 224 represents a portion of dielectric layer 216 that remains after all of sacrificial material 222 has been polished or etched away, including any sacrificial material 222 within divots 220. In some other examples, dielectric layer 224 includes some portion of sacrificial material 222. In yet other examples, dielectric layer 224 includes a portion of dielectric layer 216 and additional dielectric material deposited over dielectric layer 216 following the removal of sacrificial material 222. In any case, the second interconnect layer includes dielectric layer 224 extending over airgaps 218 within the first interconnect layer.

Figure 2H:
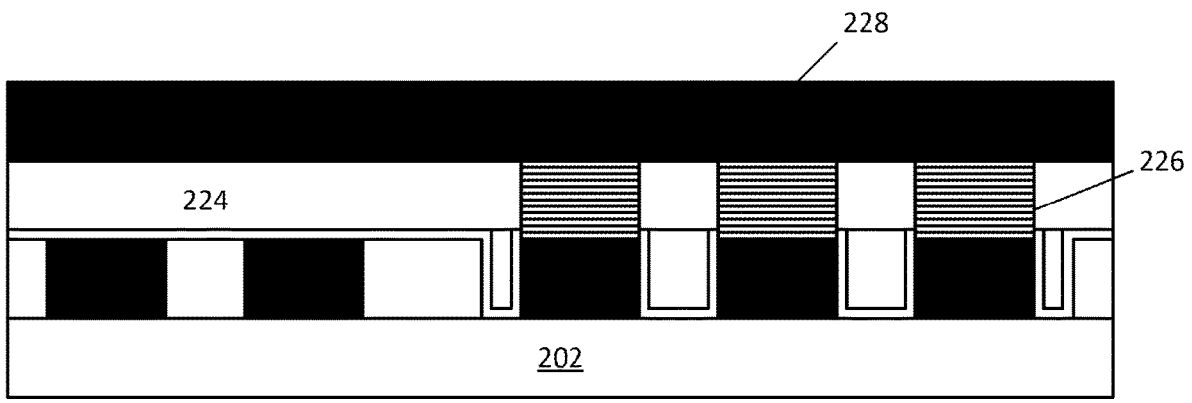

FIG. 2H is a cross-sectional view of the structure depicted in FIG. 2G following the formation of memory cells 226 (or part thereof) within a set of one or more second interconnect layers. As noted above, memory cells 226 may include various material or structural layers to form elements that can store a '0' or '1' bit. Some examples of memory cells 226 are provided in FIGS. 3A,3B, and 4. Memory cells 226 may be formed within recesses first formed through dielectric layer 224. In some cases, the access element of a given memory cell is in a first dielectric layer, and the storage element of the memory cell is in one or more second dielectric layers (e.g., such as case where the storage element is a U-shaped or pillar-shaped MIM capacitor that is relatively tall to provide a relatively large degree of capacitance). In some other examples, the access and storage elements of a given memory cell are in the same dielectric layer (e.g., such as the case where the storage element is a planar MIM capacitor having planar electrodes sandwiching a planar dielectric layer.

According to some embodiments, a second conductive trace 228 may be formed within a third interconnect layer over the set of one or more second interconnect layers. Second conductive trace 228 may be, for instance, one bitline of any number of parallel bitlines formed in the third interconnect layer. Second conductive trace 228 may have a length that is orthogonal to the lengths of first conductive traces 208. Second conductive trace 228 may include a metal, such as copper, aluminum, silver, titanium, tungsten or ruthenium, that is deposited using any one of electroplating, electroless plating, CVD, or PECVD, to name a few examples. In some embodiments, a thin barrier layer is deposited first prior to the deposition of the remaining conductive material. The thin barrier layer may include tantalum or titanium.

Figure 3A:
FIGS. 3A and 3B illustrate examples of TFT backend memory structures, in accordance with some embodiments of the present disclosure.

FIG. 3A is a cross-sectional view of an example memory cell 226 (or part thereof) sandwiched between first conductive trace 208 and second conductive trace 228. In this example, memory cell 226 includes a bottom-gated TFT having a gate dielectric layer 302, a channel layer 304, and a contact layer 306. Gate dielectric layer 302 may be any suitable dielectric material. In some embodiments, gate dielectric layer 302 includes a high-K dielectric material. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, gate dielectric layer 302 has a thickness between about 1 nm and about 10 nm. Channel layer 304 includes a semiconductor material which may be doped n-type or p-type in certain applications. In some embodiments, channel layer 304 may include one or more of indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, Si2BN, stanene, phosphorene, molybdenite, poly-III-V like indium arsenide (InAs), indium gallium arsenide (InGaAs), indium phosphide (InP), amorphous indium gallium zinc oxide (InGaZnO, sometimes referred to as a-IGZO), crystal-like InGaZnO (c-IGZO), gallium zinc oxynitride (GaZnON), zinc oxynitride (ZnON), molybdenum and sulfur, a group-VI transition metal dichalcogenide, and a c-axis aligned crystal (CAAC) layer. Contact layer 306 includes any conductive material that enhances the ohmic contact being made to channel layer 304. In one example, contact layer 306 comprises carbon or other suitable contact material.

Figure 3B:
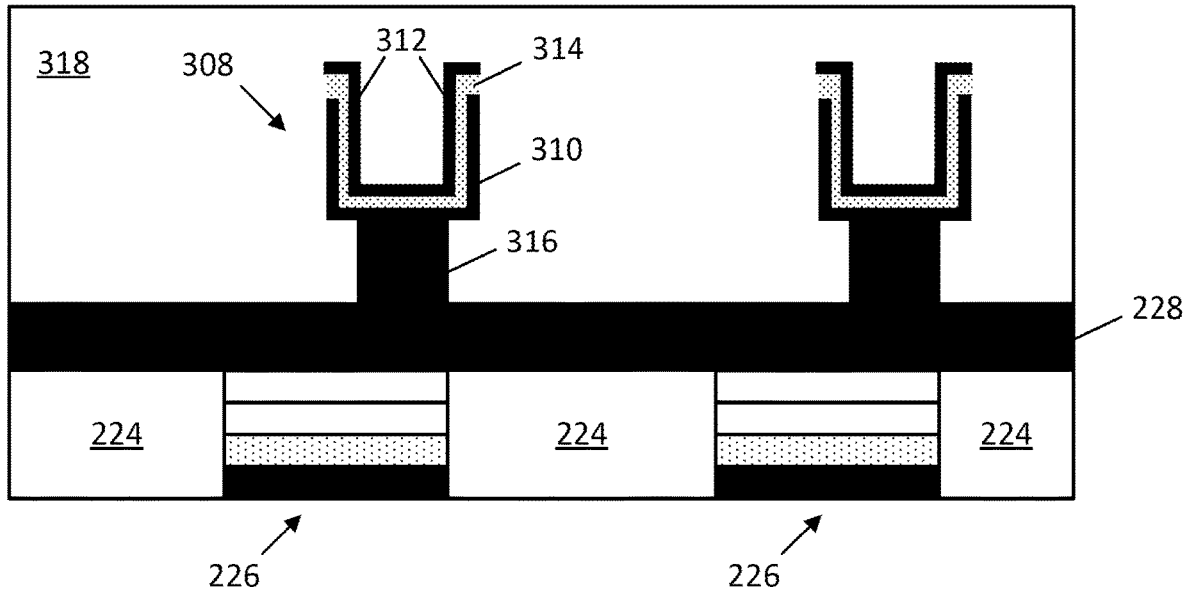

FIG. 3B illustrates a cross-sectional view of some TFT memory cells 226 configured with capacitors 308, according to some embodiments. A given TFT memory cell 226 and its associated capacitor 308 together form a single DRAM cell. According to some embodiments, capacitor 308 stores a bit of information and the TFT of the memory cell 226 allows for writing and reading that bit. For example, capacitor 308 can either be charged to a first state or discharged to a second state, and these two states represent two possible bit values of 0 or 1. As illustrated in FIG. 3B, capacitor 308 can comprise electrodes 310 and 312. In the illustrated embodiments, electrodes 310 and 312 have a U-shape to provide a large surface area between the two plates of capacitor 308. In other embodiments, capacitor 308 may have a different shape or configuration. For instance, capacitor 308 may have a relatively flat configuration with upper and lower electrodes, or a vertical pillar-shaped configuration with inner and outer electrodes. In one embodiment, electrodes 310 and 312 may include any suitable electrically conductive material, such as a metal or metal alloy material including, e.g., copper, silver, aluminum, tantalum (Ta), aluminum (Al), tungsten (W), nickel (Ni), platinum (Pt), molybdenum (Mo), manganese (Mn), or an alloy thereof, such as titanium nitride (TiN), tantalum nitride (TaN), titanium aluminum nitride (TiAlN), molybdenum oxide (MoO2), manganese oxide (MnO2), ruthenium, tungsten oxide (WO2), or another appropriate conductive material.

As can be further seen, a capacitor dielectric 314 is between electrodes 310 and 312. Capacitor dielectric 314 includes any suitable dielectric material and forms the "I" part of the MIM (metal-insulator-metal) capacitor 308. Note that capacitor dielectric 314 may include one or more distinct and/or compositionally different layers of dielectric material. For example, capacitor dielectric 314 may include one or more thin films of one or more metal oxides, such as one or more oxides of hafnium (Hf), aluminum (Al), zirconium (Zr), titanium (Ti), tantalum (Ta), or another appropriate metal.

A conductive via 316 may be provided to couple a given capacitor 308 to an underlying TFT of memory cell 226 through second conductive trace 228. Conductive via 316 may be any suitable conductive material, such as any conductive material used for first conductive traces 208 and second conductive trance 228. In some embodiments, conductive via 316 includes any of titanium (Ti), molybdenum (Mo), gold (Au), platinum (Pt), aluminum (Al), nickel (Ni), copper (Cu), chromium (Cr), hafnium (Hf), indium (In), ruthenium (Ru), or an alloy of Ti, Mo, Au, Pt, Al, Ni, Cu, Cr, Ru, TiAlN, HfAlN, InOx, HfOx, AlOx, or InAlO. Any number of capacitors 308 may be formed for any number of associated TFT memory cells 226. One or more dielectric layers 318 may be formed around capacitors 308 and include any suitable dielectric material. In some examples, dielectric layers 318 represents another one or more interconnect layers above the interconnect layer that includes second conductive trance 228.

Figure 4:
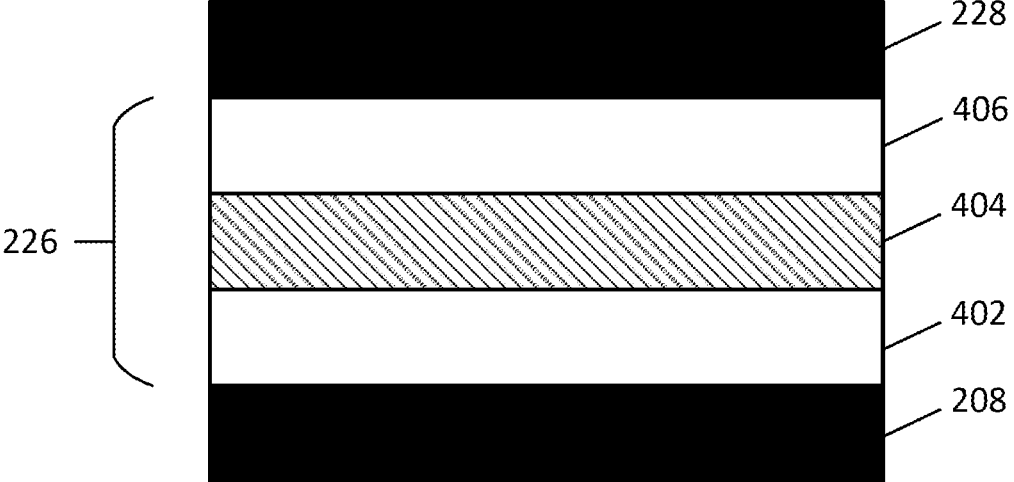
FIG. 4 illustrates an example of a phase change backend memory structure, in accordance with some embodiments of the present disclosure.

FIG. 4 is a cross-sectional view of another example memory cell 226 sandwiched between first conductive trace 208 and second conductive trace 228. In this example, memory cell 226 is a phase change memory cell having a first conductive layer 402, a memory bit layer 404, and a second conductive layer 406. Each of first and second conductive layers 402 and 406 may include any conductive material that enhances the ohmic contact being made to memory bit layer 404. In one example, conductive layers 402 and 406 comprise carbon. The various layers may be deposited using standard deposition techniques, such as chemical vapor deposition (CVD), physical vapor deposition (PVD), and atomic layer deposition (ALD) techniques.

Memory bit layer 404 includes a material that changes its threshold voltage based on the polarity of a potential applied to it to either represent a logic '0' or a logic '1' for the given memory cell 226. According to some embodiments, memory bit layer 404 includes one or more layers that includes a metalloid alloy. The metalloids include, for example, boron (B), silicon (Si), germanium (Ge), arsenic (As), antimony (Sb), tellurium (Te), Selenium (Se) and polonium (Po). In some example embodiments, chalcogenide is used as the memory bit material and can change its threshold voltage based on a polarity of an applied potential across the chalcogenide. Chalcogenide may comprise an alloy of germanium, arsenic, antimony, and tellurium, such as GeTe, GeSbTe, GeBiTe (GeTe alloyed with bismuth), GeAsSe, GeSiAsSe, or GeInSbTe (GeSbTe alloyed with indium), to name a few non-limiting examples.

Figure 5:
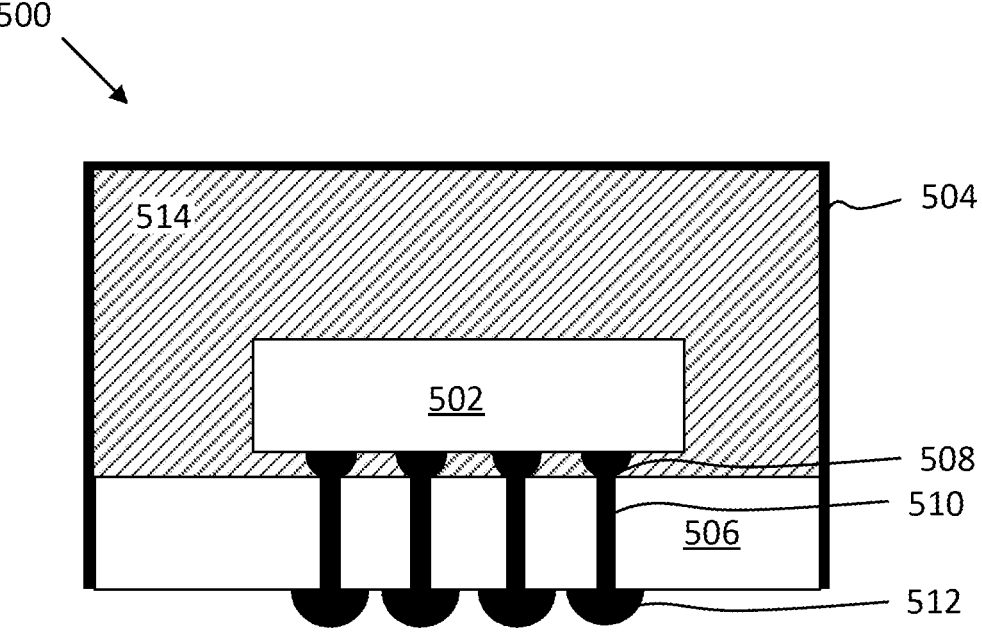
FIG. 5 illustrates a cross-section view of a chip package containing one or more semiconductor dies, in accordance with some embodiments of the present disclosure.

FIG. 5 illustrates an example embodiment of a chip package 500, in accordance with an embodiment of the present disclosure. As can be seen, chip package 500 includes one or more dies 502. One or more dies 502 may include at least one integrated circuit having a structure as described in any of the aforementioned embodiments. One or more dies 502 may include any other circuitry used to interface with other devices formed on the dies, or other devices connected to chip package 500, in some example configurations.

As can be further seen, chip package 500 includes a housing 504 that is bonded to a package substrate 506. The housing 504 may be any standard or proprietary housing, and may provide, for example, electromagnetic shielding and environmental protection for the components of chip package 500. The one or more dies 502 may be conductively coupled to a package substrate 506 using connections 508, which may be implemented with any number of standard or proprietary connection mechanisms, such as solder bumps, ball grid array (BGA), pins, or wire bonds, to name a few examples. Package substrate 506 may be any standard or proprietary package substrate, but in some cases includes a dielectric material having conductive pathways (e.g., including conductive vias and lines) extending through the dielectric material between the faces of package substrate 506, or between different locations on each face. In some embodiments, package substrate 506 may have a thickness less than 1 millimeter (e.g., between 0.1 millimeters and 0.5 millimeters), although any number of package geometries can be used. Additional conductive contacts 512 may be disposed at an opposite face of package substrate 506 for conductively contacting, for instance, a printed circuit board (PCB). One or more vias 510 extend through a thickness of package substrate 506 to provide conductive pathways between one or more of connections 508 to one or more of contacts 512. Vias 510 are illustrated as single straight columns through package substrate 506 for ease of illustration, although other configurations can be used (e.g., damascene, dual damascene, through-silicon via, or an interconnect structure that meanders through the thickness of substrate 506 to contact one or more intermediate locations therein). In still other embodiments, vias 510 are fabricated by multiple smaller stacked vias, or are staggered at different locations across package substrate 506. In the illustrated embodiment, contacts 512 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 512, to inhibit shorting.

In some embodiments, a mold material 514 may be disposed around the one or more dies 502 included within housing 504 (e.g., between dies 502 and package substrate 506 as an underfill material, as well as between dies 502 and housing 504 as an overfill material). Although the dimensions and qualities of the mold material 514 can vary from one embodiment to the next, in some embodiments, a thickness of mold material 514 is less than 1 millimeter. Example materials that may be used for mold material 514 include epoxy mold materials, as suitable. In some cases, the mold material 514 is thermally conductive, in addition to being electrically insulating.

Methodology

FIG. 6 is a flow chart of a method 600 for forming at least a portion of an integrated circuit, according to an embodiment. Various operations of method 600 may be illustrated in FIGS. 2A-2H. However, the correlation of the various operations of method 600 to the specific components illustrated in the aforementioned figures is not intended to imply any structural and/or use limitations. Rather, the aforementioned figures provide one example embodiment of method 600. Other operations may be performed before, during, or after any of the operations of method 600. Some of the operations of method 600 may be performed in a different order than the illustrated order. In some embodiments, the various operations of method 600 are performed during back end-of-the-line (BEOL) processing.

Method 600 begins with operation 602 where a first interconnect layer is formed having first parallel conductive layers extending in a first direction. The first parallel conductive layers are formed within a first dielectric layer. According to some embodiments, the first parallel conductive layers are wordlines that include any suitable metal material, such as copper that is deposited using any one of electroplating, electroless plating, CVD, or PECVD, to name a few examples. According to some embodiments, first the parallel conductive layers have a pitch between about 30 nm and about 300 nm, or between about 100 nm and about 150 nm. A top surface of the first parallel conductive layers may be polished to be substantially planar with a top surface of the first dielectric layer. It should be understood that the interconnect layer having the first parallel conductive layers may be any interconnect layer within an interconnect region having a stack of interconnect layers above a plurality of semiconductor devices.

Method 600 continues with operation 604 where recesses are formed through the first dielectric layer between adjacent first parallel conductive layers. A masking layer may be formed that protects the first dielectric layer between other conductive traces in the first interconnect layer not associated with the memory array. In some examples, an isotropic etching process is performed to remove the dielectric material from between the adjacent first parallel conductive layers. The recesses may have a bottom surface that is substantially planar with a bottom surface of the first parallel conductive layers. In some other examples, the recesses between the first parallel conductive layers extend deeper than a thickness of the first parallel conductive layers. In such examples, undercutting beneath the first parallel conductive layers may occur to some degree.

Method 600 continues with operation 606, where a second dielectric layer is formed over the first dielectric layer and over the recesses as part of a second interconnect layer. According to some embodiments, the second dielectric layer lays over the recesses and traps whatever air is present at the time within the recesses to form airgaps between the adjacent first parallel conductive layers. The second dielectric layer may be similar to the first dielectric layer. The airgaps may include an inert gas or any other gas present in the deposition chamber during the deposition of the second dielectric layer. In some embodiments, the airgaps are at a vacuum pressure.

According to some embodiments, the second dielectric layer includes a low-K dielectric material, such as silicon oxide or silicon oxycarbide, and is deposited using PECVD or PVD. The deposition process parameters may be tuned to deposit the second dielectric layer such that it does not conformally coat the inner surfaces of the recesses. In some embodiments, a top surface of the second dielectric layer may include divots or small recesses over regions where the second dielectric layer buckles into the recesses below it. Similar divots may extend into an upper portion of the airgaps, as shown in the example of FIG. 2F.

Method 600 continues with operation 608, where the second dielectric layer is planarized. As noted above, the top surface of the second dielectric layer may not be planar following deposition due to the presence of the recesses below it. According to some embodiments, a sacrificial fill (e.g., any suitable dielectric or self-planarizing spin-on material) may be deposited over the second dielectric layer to fill any divots or recesses in the top surface of the second dielectric layer and subsequently polished back to produce a planar top surface. Accordingly, the resulting planar second dielectric layer may include a portion of the sacrificial fill or portions of other dielectric materials deposited on it.

Method 600 continues with operation 610, where recesses are formed within the second dielectric layer. According to some embodiments, the recesses are aligned generally over the underlying first parallel conductive layers. The recesses may be formed using any standard etching process, such as isotropic etching of the dielectric material. According to some embodiments, these recesses designate the areas for the memory cells and thus may be sized appropriately. In some examples, the recesses are spaced from each other in a checkerboard pattern having rows and columns of recesses across multiple first parallel conductive layers, such that a given column of recesses are formed over a single conductive layer of the first parallel conductive layers and a given row of recesses are each formed over a different conductive layer of the first parallel conductive layers.

Method 600 continues with operation 612, where memory cells (or part thereof) are formed within the recesses created during operation 610 (e.g., the recesses in the second dielectric layer). The memory cells may include various material or structural layers (e.g., one or more interconnect layers) to form elements that can store a '0' or '1' bit. Some examples of memory cells include TFT memory cells, phase change memory cells, or FLASH memory cells. The top surface of the memory cells may be polished to be substantially planar with a top surface of the second dielectric layer.

Alternatively, rather than first forming recesses and filling the recesses with material layers to form the memory cells, the material layers may each be blanket deposited across the structure and etched back to form individual islands of memory cells aligned over the underlying conductive layers.

Method 600 continues with operation 614, where a plurality of parallel second conductive layers is formed over the memory cells as part of a third interconnect layer. According to some embodiments, the plurality of parallel second conductive layers extend lengthwise in a direction that is orthogonal to a lengthwise direction of the parallel first conductive layers. According to some embodiments, each memory cell is arranged in a location between where a given second conductive layer passes over a given first conductive layer. In this way, a cross-hatch pattern may be formed between the parallel first conductive layers and parallel second conductive layers with each memory cell coupled to one of the first conductive layers and one of the second conductive layers. According to some embodiments, the second parallel conductive layers are bitlines that include any suitable metal material, such as copper that is deposited using any one of electroplating, electroless plating, CVD, or PECVD, to name a few examples.

Example System

Figure 7:
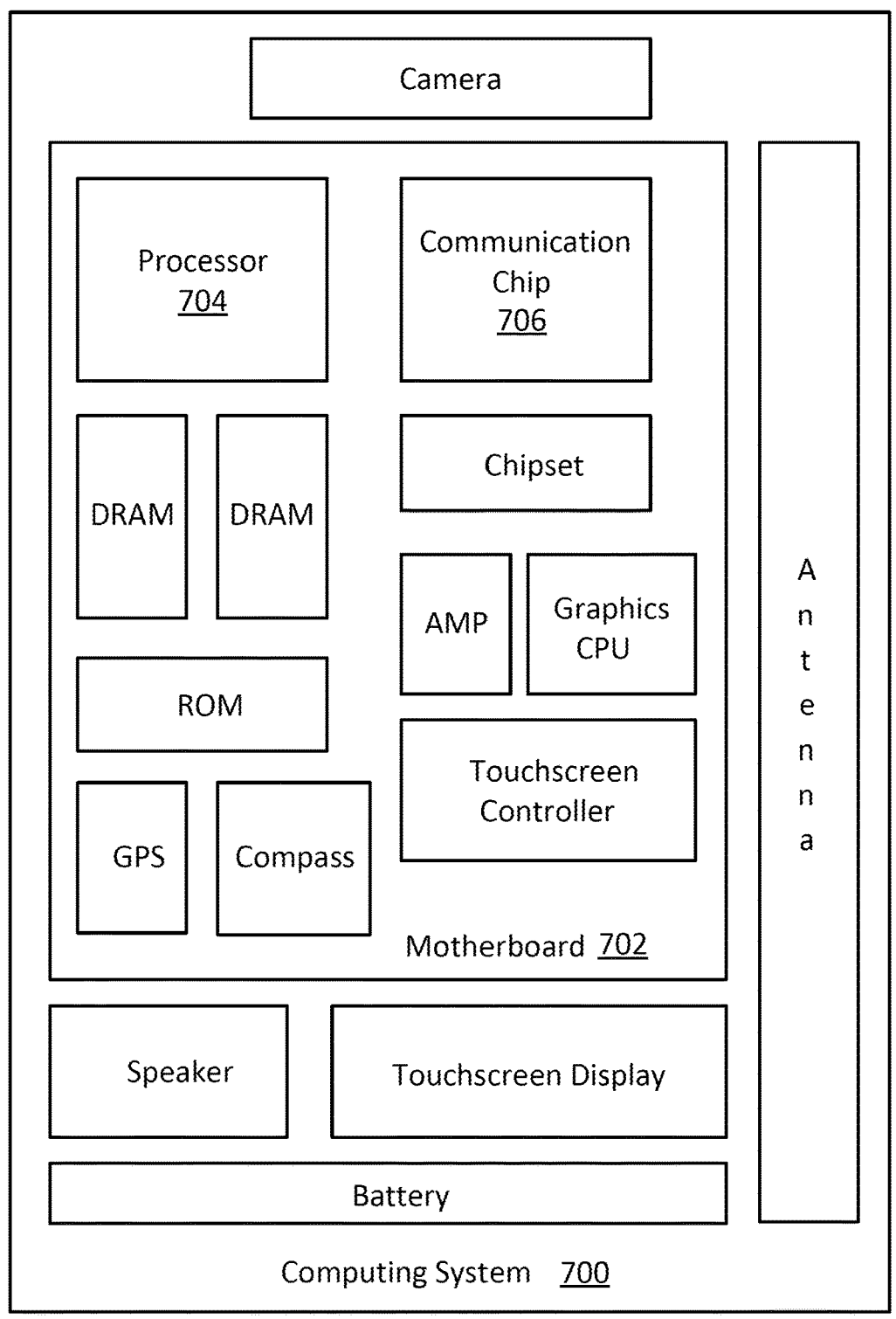
FIG. 7 illustrates a computing system including one or more integrated circuits, as variously described herein, in accordance with an embodiment of the present disclosure.

FIG. 7 is an example computing system implemented with one or more of the integrated circuit structures as disclosed herein, in accordance with some embodiments of the present disclosure. As can be seen, the computing system 700 houses a motherboard 702. The motherboard 702 may include a number of components, including, but not limited to, a processor 704 and at least one communication chip 706, each of which can be physically and electrically coupled to the motherboard 702, or otherwise integrated therein. As will be appreciated, the motherboard 702 may be, for example, any printed circuit board (PCB), whether a main board, a daughterboard mounted on a main board, or the only board of system 700, etc.

Depending on its applications, computing system 700 may include one or more other components that may or may not be physically and electrically coupled to the motherboard 702. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 700 may include one or more integrated circuit structures or devices configured in accordance with an example embodiment (e.g., a module including an integrated circuit having interconnect structures that include backend memory cells with airgaps between the wordlines). In some embodiments, the inclusion of the backend memory cells may reduce the number of other DRAM chips included within computing system 700. In some embodiments, multiple functions can be integrated into one or more chips (e.g., for instance, note that the communication chip 706 can be part of or otherwise integrated into the processor 704).

The communication chip 706 enables wireless communications for the transfer of data to and from the computing system 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing system 700 includes an integrated circuit die packaged within the processor 704. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 706 also may include an integrated circuit die packaged within the communication chip 706. In accordance with some such example embodiments, the integrated circuit die of the communication chip includes one or more semiconductor devices as variously described herein. As will be appreciated in light of this disclosure, note that multi-standard wireless capability may be integrated directly into the processor 704 (e.g., where functionality of any chips 706 is integrated into processor 704, rather than having separate communication chips). Further note that processor 704 may be a chip set having such wireless capability. In short, any number of processor 704 and/or communication chips 706 can be used. Likewise, any one chip or chip set can have multiple functions integrated therein.

In various implementations, the computing system 700 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 700 may be combined or integrated in a system-on-a-chip (SoC) architecture. In some embodiments, the components may be hardware components, firmware components, software components or any suitable combination of hardware, firmware or software.

FURTHER EXAMPLE EMBODIMENTS

The following examples pertain to further embodiments, from which numerous permutations and configurations will be apparent.

Example 1 is an integrated circuit that includes a plurality of semiconductor devices, an interconnect region above the plurality of semiconductor devices and having a plurality of stacked interconnect layers, a first interconnect layer of the plurality of stacked interconnect layers, a second interconnect layer of the plurality of stacked interconnect layers, and a third interconnect layer of the plurality of stacked interconnect layers. The first interconnect layer comprises a plurality of first conductive layers extending lengthwise along a first direction and airgaps between adjacent ones of the plurality of first conductive layers. The second interconnect layer is over the first interconnect layer and includes at least part of a first memory cell and at least part of a second memory cell laterally adjacent to the first memory cell where the first and second memory cells are each over a corresponding first conductive layer. The third interconnect layer is over the second interconnect layer and has a second conductive layer extending lengthwise along a second direction different from the first direction.

Example 2 includes the subject matter of Example 1, wherein the first and second memory cells each includes a stack of layers that form a thin film transistor (TFT).

Example 3 includes the subject matter of Example 1, wherein the first and second memory cells each includes a stack of layers having at least one layer comprising a phase change material.

Example 4 includes the subject matter of Example 3, wherein the phase change material comprises a chalcogenide.

Example 5 includes the subject matter of any one of Examples 1-4, wherein the second direction is orthogonal to the first direction.

Example 6 includes the subject matter of any one of Examples 1-5, wherein the second interconnect layer comprises a dielectric layer between the first and second memory cells.

Example 7 includes the subject matter of any one of Examples 1-6, wherein one or more inner surfaces of the airgaps includes a dielectric liner.

Example 8 includes the subject matter of Example 7, wherein the dielectric liner comprises silicon and nitrogen.

Example 9 includes the subject matter of any one of Examples 1-8, wherein the airgaps comprise an inert gas.

Example 10 includes the subject matter of any one of Examples 1-9, wherein the second conductive layer extends over the at least part of the first memory cell and the at least part of the second memory cell.

Example 11 is a printed circuit board comprising the integrated circuit of any one of Examples 1-10.

Example 12 is an electronic device that includes a chip package having one or more dies. At least one of the one or more dies includes a plurality of semiconductor devices, an interconnect region above the plurality of semiconductor devices and having a plurality of stacked interconnect layers, a first interconnect layer of the plurality of stacked interconnect layers, a second interconnect layer of the plurality of stacked interconnect layers, and a third interconnect layer of the plurality of stacked interconnect layers. The first interconnect layer comprises a plurality of first conductive layers extending lengthwise along a first direction and airgaps between adjacent ones of the plurality of first conductive layers. The second interconnect layer is over the first interconnect layer and includes at least part of a first memory cell and at least part of a second memory cell laterally adjacent to the first memory cell where the first and second memory cells are each over a corresponding first conductive layer. The third interconnect layer is over the second interconnect layer and has a second conductive layer extending lengthwise along a second direction different from the first direction.

Example 13 includes the subject matter of Example 12, wherein the at least portions of the first and second memory cells each includes a stack of layers that form a thin film transistor (TFT).

Example 14 includes the subject matter of Example 12, wherein the at least portions of the first and second memory cells each includes a stack of layers having at least one layer comprising a phase change material.

Example 15 includes the subject matter of Example 14, wherein the phase change material comprises a chalcogenide.

Example 16 includes the subject matter of any one of Examples 12-15, wherein the second direction is orthogonal to the first direction.

Example 17 includes the subject matter of any one of Examples 12-16, wherein the second interconnect layer comprises a dielectric layer between of the first and second memory cells.

Example 18 includes the subject matter of any one of Examples 12-17, wherein one or more inner surfaces of the airgaps includes a dielectric liner.

Example 19 includes the subject matter of Example 18, wherein the dielectric liner comprises silicon and nitrogen.

Example 20 includes the subject matter of any one of Examples 12-19, wherein the airgaps comprise an inert gas.

Example 21 includes the subject matter of any one of Examples 12-20, further comprising a printed circuit board, wherein the chip package is attached to the printed circuit board.

Example 22 is a method of forming an integrated circuit. The method includes forming a first interconnect layer above a plurality of semiconductor devices and forming a set of one or more second interconnect layers over the first interconnect layer. Forming the first interconnect layer includes forming a first dielectric layer, forming first recesses in the first dielectric layer, forming conductive layers in the first recesses, and forming second recesses in the first dielectric layer between adjacent ones of the conductive layers. Forming the second interconnect layer(s) includes forming a second dielectric layer over the first dielectric layer and over the second recesses, such that airgaps are formed within the second recesses. The method may further include, for instance, forming third recesses in the second dielectric layer over the conductive layers, and forming at least partial memory cells (e.g., memory cell structures) in the third recesses.

Example 23 includes the subject matter of Example 22, wherein forming memory cell structures comprises forming thin film transistors.

Example 24 includes the subject matter of Example 23, wherein forming thin film transistors comprises depositing a gate dielectric layer, a semiconductor layer over the gate dielectric layer, and a conductive contact layer over the semiconductor layer.

Example 25 includes the subject matter of Example 22, wherein forming memory cell structures comprises depositing a phase change material.

Example 26 includes the subject matter of any one of Examples 22-25, wherein forming the first interconnect layer further comprises depositing a dielectric liner over inner surfaces of the second recesses.

Example 27 includes the subject matter of any one of Examples 22-26, wherein the dielectric liner has a different dielectric material compared to the first dielectric layer and the second dielectric layer.

Example 28 includes the subject matter of any one of Examples 22-27, wherein the conductive layers are first conductive layers, the method further comprising forming a third interconnect layer over the second interconnect layer, wherein the forming of the third interconnect layer comprises forming a second conductive layer that extends over the memory cell structures.

Example 29 is an integrated circuit that includes an interconnect region above a plurality of semiconductor devices and having a plurality of stacked interconnect layers. A first interconnect layer of the plurality of stacked interconnect layers includes a plurality of parallel first conductive layers extending lengthwise along a first direction and airgaps between adjacent ones of the plurality of parallel first conductive layers. A second interconnect layer of the plurality of stacked interconnect layers is over the first interconnect layer and has at least portions of first and second memory cells with each memory cell being over a corresponding first conductive layer. A third interconnect layer of the plurality of stacked interconnect layers is over the second interconnect layer and has a plurality of parallel second conductive layers extending lengthwise along a second direction different from the first direction. At least one of the second conductive layers extends over the at least a portion of the first and second memory cells.

Example 30 includes the subject matter of Example 29, wherein the at least portions of the first and second memory cells each includes a stack of layers that form a thin film transistor (TFT).

Example 31 includes the subject matter of Example 29, wherein the at least portions of the first and second memory cells each includes a stack of layers having at least one layer comprising a phase change material.

Example 32 includes the subject matter of Example 31, wherein the phase change material comprises a chalcogenide.

Example 33 includes the subject matter of any one of Examples 29-32, wherein the second direction is orthogonal to the first direction.

Example 34 includes the subject matter of any one of Examples 29-33, wherein the second interconnect layer comprises a dielectric layer between the first and second memory cells.

Example 35 includes the subject matter of any one of Examples 29-34, wherein one or more inner surfaces of the airgaps includes a dielectric liner.

Example 36 includes the subject matter of Example 35, wherein the dielectric liner comprises silicon and nitrogen.

Example 37 includes the subject matter of any one of Examples 29-36, wherein the airgaps comprise an inert gas.

Example 38 is a printed circuit board comprising the integrated circuit of any one of Examples 29-37.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit, comprising:
a plurality of semiconductor devices;
an interconnect region above the plurality of semiconductor devices, the interconnect region comprising a plurality of stacked interconnect layers;
a first interconnect layer of the plurality of stacked interconnect layers, the first interconnect layer comprising a plurality of first conductive layers extending lengthwise along a first direction and airgaps between adjacent ones of the plurality of first conductive layers;
a dielectric liner on sidewalls of at least one first conductive layer of the plurality of first conductive layers and on a top surface of a lower interconnect layer beneath the first interconnect layer;
a second interconnect layer of the plurality of stacked interconnect layers, the second interconnect layer over the first interconnect layer and including at least part of a first memory cell and at least part of a second memory cell laterally adjacent to the first memory cell, the first and second memory cells each being over a corresponding first conductive layer; and
a third interconnect layer of the plurality of stacked interconnect layers, the third interconnect layer over the second interconnect layer and having a second conductive layer extending lengthwise along a second direction different from the first direction.

2. The integrated circuit of claim 1, wherein the first and second memory cells each includes a stack of layers that form a thin film transistor (TFT).

3. The integrated circuit of claim 1, wherein the second direction is orthogonal to the first direction.

4. The integrated circuit of claim 1, wherein the dielectric liner comprises silicon and nitrogen.

5. The integrated circuit of claim 1, wherein the airgaps comprise an inert gas.

6. The integrated circuit of claim 1, wherein the second conductive layer extends over the at least part of the first memory cell and the at least part of the second memory cell.

7. A printed circuit board comprising the integrated circuit of claim 1.

8. The integrated circuit of claim 1, wherein the second interconnect layer comprises a dielectric layer between the first and second memory cells.

9. An electronic device, comprising:
a chip package comprising one or more dies, at least one of the one or more dies comprising a plurality of semiconductor devices;
an interconnect region above the plurality of semiconductor devices, the interconnect region comprising a plurality of stacked interconnect layers;
a first interconnect layer of the plurality of stacked interconnect layers, the first interconnect layer comprising a plurality of first conductive layers extending lengthwise along a first direction and airgaps between adjacent ones of the plurality of first conductive layers;
a dielectric liner on sidewalls of at least one first conductive layer of the plurality of first conductive layers and on a top surface of a lower interconnect layer beneath the first interconnect layer;
a second interconnect layer of the plurality of stacked interconnect layers, the second interconnect layer over the first interconnect layer and having at least portions of first and second memory cells, each of the first and second memory cells being over a corresponding first conductive layer; and
a third interconnect layer of the plurality of stacked interconnect layers, the third interconnect layer over the second interconnect layer and having a second conductive layer extending lengthwise along a second direction different from the first direction.

10. The electronic device of claim 9, wherein the at least portions of the first and second memory cells each includes a stack of layers that form a thin film transistor (TFT).

11. The electronic device of claim 9, wherein the second direction is orthogonal to the first direction.

12. The electronic device of claim 9, wherein the dielectric liner comprises silicon and nitrogen.

13. The electronic device of claim 9, wherein the airgaps comprise an inert gas.

14. The electronic device of claim 9, wherein the second interconnect layer comprises a dielectric layer between the first and second memory cells.

15. An integrated circuit, comprising:
an interconnect region above a plurality of semiconductor devices, the interconnect region comprising a plurality of stacked interconnect layers;
a first interconnect layer of the plurality of stacked interconnect layers, the first interconnect layer comprising a plurality of parallel first conductive layers extending lengthwise along a first direction and airgaps between adjacent ones of the plurality of parallel first conductive layers;

a dielectric liner on sidewalls of at least one first conductive layer of the plurality of parallel first conductive layers and on a top surface of a lower interconnect layer beneath the first interconnect layer;

a second interconnect layer of the plurality of stacked interconnect layers, the second interconnect layer over the first interconnect layer and having at least portions of first and second memory cells, each of the first and second memory cells being over a corresponding first conductive layer; and a third interconnect layer of the plurality of stacked interconnect layers, the third interconnect layer over the second interconnect layer and having a plurality of parallel second conductive layers extending lengthwise along a second direction different from the first direction, wherein at least one of the second conductive layers extends over the at least portions of the first and second memory cells.

16. The integrated circuit of claim 15, wherein the at least portions of the first and second memory cells each includes a stack of layers that form a thin film transistor (TFT).

17. The integrated circuit of claim 15, wherein the second direction is orthogonal to the first direction.

18. The integrated circuit of claim 15, wherein the dielectric liner comprises silicon and nitrogen.

19. The integrated circuit of claim 15, wherein the airgaps comprise an inert gas.

20. The integrated circuit of claim 15, wherein the second interconnect layer comprises a dielectric layer between the first and second memory cells.

* * * * *